United States Patent
Huang et al.

[11] Patent Number: 6,133,757
[45] Date of Patent: Oct. 17, 2000

[54] HIGH-SPEED AND LOW-NOISE OUTPUT BUFFER

[75] Inventors: Jin-Cheng Huang, Yung-Ho; Yuantsang Liaw, Taichung, both of Taiwan

[73] Assignee: VIA Technologies, Inc., Taipei Hsien, Taiwan

[21] Appl. No.: 09/156,032

[22] Filed: Sep. 17, 1998

[30] Foreign Application Priority Data

Jul. 16, 1998 [TW] Taiwan ................................ 87111577

[51] Int. Cl.$^7$ .................. H03K 19/0175; H03K 19/094
[52] U.S. Cl. ................................. 326/87; 326/27; 326/83
[58] Field of Search .................................. 326/83, 85, 17, 326/27, 26, 87, 86, 90, 91, 73, 74, 66, 67

[56] References Cited

U.S. PATENT DOCUMENTS

| | | | |
|---|---|---|---|
| 5,095,230 | 3/1992 | Takai et al. | 326/60 |
| 5,192,879 | 3/1993 | Aoki et al. | 326/87 |
| 5,471,150 | 11/1995 | Jung et al. | 326/87 |
| 5,537,070 | 7/1996 | Risinger | 327/170 |
| 5,539,341 | 7/1996 | Kuo | 327/108 |
| 5,568,062 | 10/1996 | Kaplinsky | 326/27 |
| 5,969,554 | 10/1999 | Chan et al. | 327/170 |

*Primary Examiner*—Michael Tokar
*Assistant Examiner*—Daniel D. Chang
*Attorney, Agent, or Firm*—Hickman Coleman & Hughes, LLP

[57] ABSTRACT

A high-speed and low-noise output buffer with a slew control function in coordination with a GTL+ signal specification according to the invention. In the output buffer, general and speed driving elements concurrently drives a last output element. As an input signal is changed from a first logic level to a second logic level, the general and speed driving elements simultaneously start functioning. First, the speed driving element pulls down the control voltage of the output element to a potential having a potential difference from an expected final potential. Then, the general driving element pulls down the control voltage to close to the expected final potential. The output potential of the output element changes more quickly at the beginning. When close to the expected final potential, the variation of the output potential slows down. Since, the delay time of the output buffer is reduced without causing an over large ring back on the output signal, the output buffer with high-speed and low-noise can be obtained.

13 Claims, 3 Drawing Sheets

HIGH-SPEED AND LOW-NOISE OUTPUT BUFFER

CROSS-REFERENCE TO RELATED APPLICATION

This application claims the priority benefit of Taiwan application Ser. No. 87111577, filed Jul. 16, 1998, the full disclosure of which is incorporated herein by reference.

BACKGROUND OF THE INVENTION

1. Field of the Invention

The invention relates to an output buffer, and more particularly to a high-speed and low-noise output buffer with a slew control function in coordination with a GTL+ signal specification.

2. Description of the Related Art

In a typical digital circuit, two digital signals with 0V and 5V generally represents two different logic levels. Devices used in the digital circuit include TTL and CMOS devices. Digital circuits constituted by TTL devices have faster switch speeds, but have more consumption in DC power while digital circuits constituted by CMOS devices have less consumption in DC power, but have slower switch speed and higher noise. Furthermore, as the operating frequencies of digital circuits increase to several tens of MHz, devices improperly arranged or separated from each other in the digital circuits can cause the problem of Electro Magnetic Interference (EMI).

The operating voltages of CMOS digital circuits are getting lower and lower in line with the progress in semiconductor process. If the operating voltages of two integrated circuits (ICs) located on both ends of a transmission line are not consistent, the two ICs output two high logic levels with different potentials. To resolve those problems mentioned above, a GTL (Gunning Transceiver Logic) signal specification for output buffer is introduced. Later, a GTL+ signal specification is further provided for improvement. Since the magnitude of the GTL+ signal is between 0V and 1.5V, and one terminal of a signal transmission line is connected to 1.5V via a terminal resistor, the difference between the operating voltages of two ICs cannot make the output high potentials thereof different, when the transmission line is used for a two-way transmission.

Referring to FIG. 1, an output buffer 100 receives an input signal A, and then transmits an output signal $V_o$, wherein the input signal A generally includes two logic levels, a high potential and a low potential, and the output signal $V_o$ varies with the input signal A. Next, the output signal $V_o$ is transmitted to output/input ends of another device 171 via a transmission line 160. Since an open drain method for connecting the FET 130 is adopted, the two-way transmission can be implemented on the transmission line. As an FET 130 is turned off, an input buffer 180 can receive signals coming from another device 172. In order to make high potentials to be the same during the two-way transmission, one terminal of the transmission line 160 is connected to power source Vtt (generally 1.5V) via a terminal resistor 165.

The output buffer 100 includes two driving transistors (FETs) 110 and 120 and an output transistor (FET) 130. The two driving transistors 110 and 120 receive the input signal A, and then create a sufficient driving current to drive the output transistor 130. Subsequently, the output transistor 130 provides a further powerful driving capability to drive other devices connected to the transmission line 160.

When the input signal A is at a low potential, the FET 110 is turned on to pull up the potential of the gate of the FET 130 to a high potential, thereby turning on the FET 130. Therefore, the potential of the output signal $V_o$ is pulled down to close to the ground potential. If the terminal resistor 165 has a resistance of Rtt, and the resistance of the FET 130 after being turned on is Rm, then the output voltage $V_o$, being at a low potential, can be expressed as follows:

$$Vo = Vtt * Rm / Rm + Rtt$$

When the input signal A is at a high potential, the FET 120 is turned on to pull down the potential of the gate of the FET 130 to the ground potential, thereby turning off the FET 130. Since the FET 130 is connected to the transmission line 160 by an open drain method, the potential of the output signal $V_o$ is pull up to the power source $V_{tt}$ serving as a high potential when the FET 130 is turned off. Moreover, the output state can be changed into an input state, such that the input buffer 180 can receive signals transmitted from other devices.

Referring to FIG. 2, a wave form (A) represents the input signal A, wherein a low potential is changed into a high potential at a time t1. Here, the discussion only focuses on the signal variation of the output buffer, and the time delay of the input signal A is therefore omitted. When operating at a low frequency, a low potential is completely changed into a high potential after a delay time d1 as shown in a wave form (B) representing the output signal $V_o$. Consequently, how to shorten the delay time d1 thereby to increase the operating frequency becomes more important. However, the minimum of driving capability of the output transistor is regulated by the specification of a general output buffer. Therefore, only the capabilities of driving current of the driving transistors of the output buffer 100 can be enhanced to increase the switch speeds of the transistors. However, if the capabilities of driving current of the driving transistors 110 and 120 are merely enhances to shorten the delay time, it further worsen the output signal. As can be see from a wave form (C) shown in FIG. 2, after a delay time d2, the output signal $V_o$ is changed from a low potential into a high potential. However, since the FET 130 is swiftly turned off, resulting in over speed on the change of the output signal $V_o$, the ring back indicated by reference symbol P is created. Thus, it is difficult for the receiving end to distinguish signals between the logic levels "0" and "1", causing the system unstable.

It is obvious that the disadvantages of the output buffer according to the prior art as shown in FIG. 1 is described follows.

(1) Although the noise is reduced by decreasing the driving capability of the driving transistors of the output buffer, thereby slowly turning on or off the output transistor, the delay time is increased, resulting in being unable to increase the operating frequency.

(2) By increasing the operating frequency, the driving capability of the driving transistors of the output buffer can be increased. However, this causes the output transistor to be swiftly turned on or off, leading to the increase of the switch speed. That is, the ring back is easily encountered, creating unnecessary noises and causing the system's operating unstable even though the operating frequency is increased.

SUMMARY OF THE INVENTION

In view of the above, the main object of the invention is to provide a high-speed and low-noise output buffer with a slew control function, which is able to efficiently increase the operating frequency thereof without creating ring back and noises.

A high-speed and low-noise output buffer according to a first embodiment of the invention receives an input signal including a first logic level and a second logic level and transmits an output signal. The output buffer includes a first general driving element, a first speed driving element, a second general driving element, a second speed driving element and an output element.

The first general driving element has a first end, a second end and a third end, wherein the first end receives the input signal, and the second end is coupled to a positive power source. The first general driving element is electrically conducted between the second end and the third end thereof when the input signal is at the first logic level.

The first speed driving element has much more powerful driving capability than the first general driving element and has a first end, a second end and a third end, wherein the first end receives the input signal, and the second end is coupled to the positive power source. The first speed driving element is electrically conducted between the second end and the third end thereof when the input signal is at the first logic level, and a first potential difference exits between the second end and the third end after the first speed driving element is electrically conducted.

The second general driving element has a first end, a second end and a third end, wherein the first end receives the input signal, and the third end is coupled to ground. The general driving element is electrically conducted between the second end and the third end thereof when the input signal is at the second logic level.

The second speed driving element has much more powerful driving capability than the second general driving element and has a first end, a second end and a third end, wherein the first end receives the input signal, the third end is coupled to the ground. The second speed driving element is electrically conducted between the second end and the third end thereof when the input signal is at the second logic level, and a second potential difference exits between the second end and the third end after the second speed driving element is electrically conducted.

The output element has a first end, a second end and a third end, wherein the first end is coupled to the third end of the first general driving element, the third end of the first speed driving element, the second end of the second general driving element and the second end of the second speed driving element, the third end is coupled to the ground, and the second end transmits the output signal. Moreover, the output element is electrically conducted between the second end and the third end thereof when the first general driving element and the first speed driving element are electrically conducted. The output element is not electrically conducted between the second end and the third end thereof when the second general driving element and the second speed driving element are electrically conducted.

According to the first embodiment of the invention, the first potential difference is in the range of 0V to 1V, and the second potential difference is also in the range of 0V to 1V.

A high-speed and low-noise output buffer according to a second embodiment of the invention receives a first input signal including a first logic level and a second logic level and a second input signal complementary to the first input signal, and transmits an output signal. The output buffer includes a first general transistor, a first speed transistor, a second general transistor, a second speed transistor and an output transistor.

The gate of the first general transistor receives the first input signal, and the source of the first general transistor is coupled to a positive power source. The first general transistor is electrically conducted between the drain and the source thereof when the input signal is at the first logic level.

The first speed transistor has much more powerful driving capability than the fist general transistor, wherein the gate of the first speed transistor receives the second input signal and the source of the first speed transistor is coupled to the positive power source. The first speed transistor is conducted between the drain and the source thereof when the first input signal is at the first logic level, and a first potential difference exits between the drain and the source thereof after the first speed transistor is electrically conducted.

The gate of the second general transistor receives the first input signal, and the source of the second general transistor is coupled to ground. The second general transistor is electrically conducted between the drain and the source thereof when the first input signal is at the second logic level.

The second speed transistor has much more powerful driving capability than the second general transistor, wherein the gate of the second speed transistor receives the second input signal, and the source of the second speed transistor is coupled to the ground. The second speed transistor is electrically conducted between the drain and the source thereof when the first input signal is at the second logic level, and a second potential difference exits between the drain and the source thereof after the second speed transistor is electrically conducted.

The gate of the output transistor is coupled to the drain of the first general transistor, the drain of the first speed transistor, the drain of the second general transistor and the drain of the second speed transistor. The source of the output transistor is coupled to the ground while the drain of the output transistor transmits the output signal. Furthermore, the output transistor is electrically conducted between the drain and the source thereof when the first general transistor and the first speed transistor are electrically conducted. The output transistor are not electrically conducted between the drain and the source thereof when the second general transistor and the second speed transistor are electrically conducted.

According to the second embodiment of the invention, the first logic level has a potential close to the positive power source while the second logic level has a potential close to the ground potential. Moreover, the first general transistor and the second speed transistor are PMOS FETs, and the first speed transistor, the second general transistor and the output transistor are NMOS FETs. The first potential difference is equal to the threshold voltage NMOS FET, and the second potential voltage is equal to the threshold voltage of PMOS FET.

BRIEF DESCRIPTION OF THE DRAWINGS

The present invention will be more fully understood from the detailed description given hereinbelow and the accompanying drawings which are given by way of illustration only, and thus do not limit the present invention, and wherein.

DETAILED DESCRIPTION OF THE EMBODIMENTS

Figure 1:
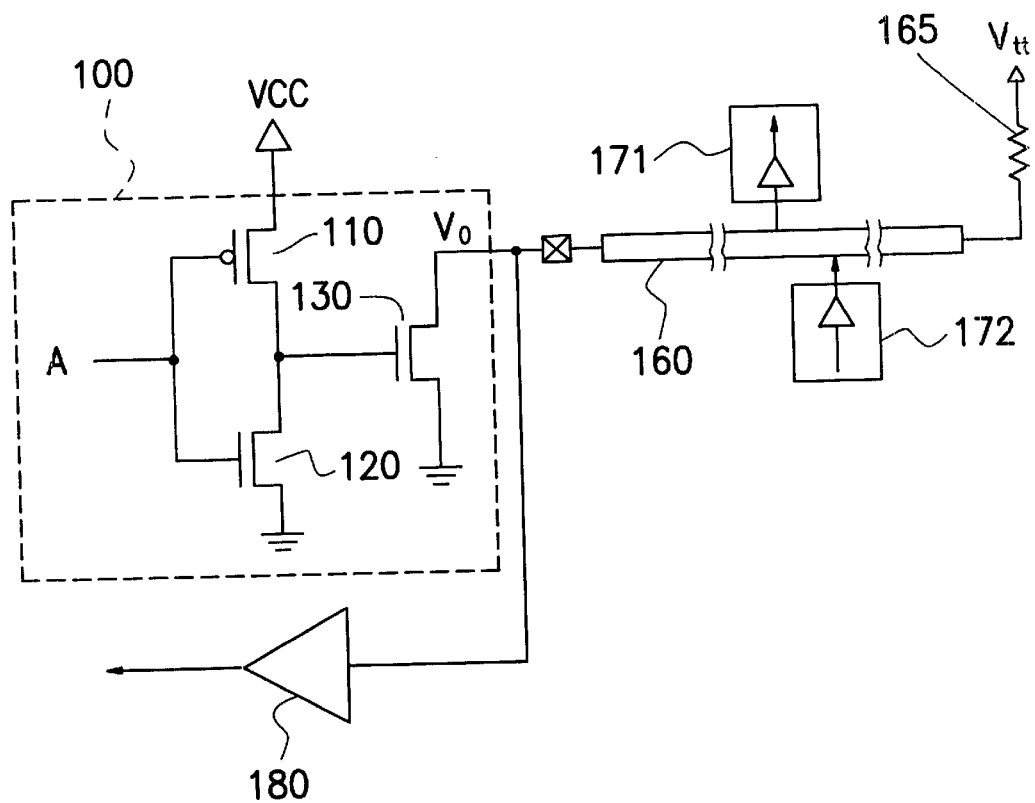
FIG. 1 is a circuit diagram showing an output buffer according to the prior art.
Figure 2:
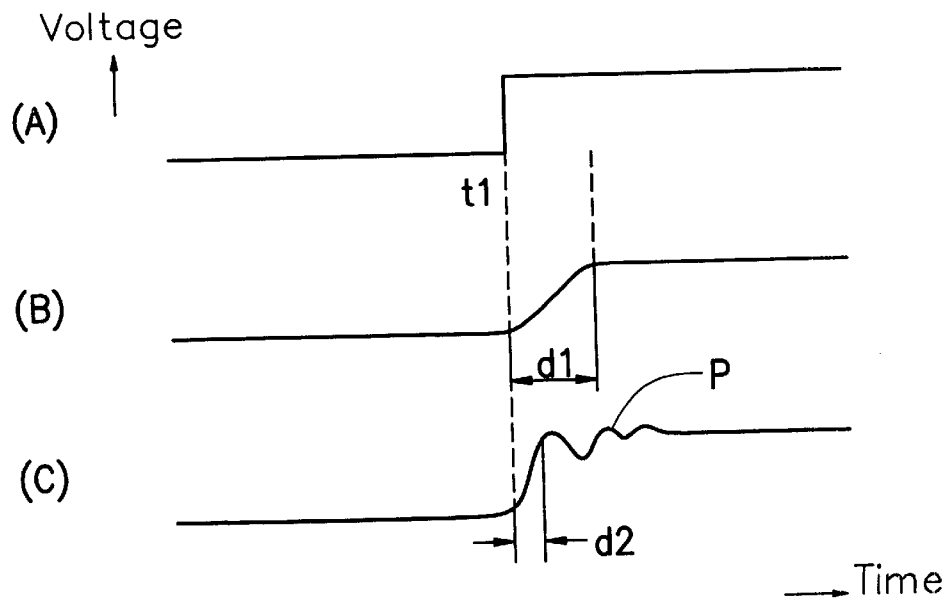
FIG. 2 shows the wave forms of the input and output signals of an output buffer according to the prior art.
Figure 3:
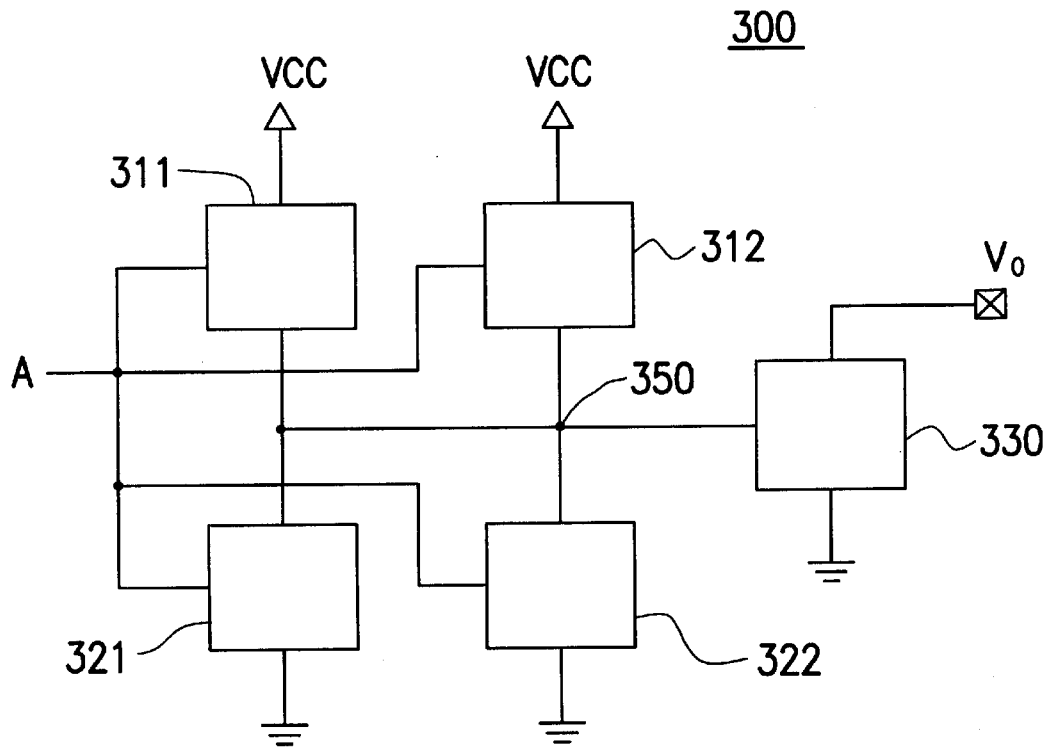
FIG. 3 is a block diagram showing a high-speed and low-noise output buffer according to the invention.

Referring to FIG. 3, a high-speed and low-noise output buffer 300 according to the invention is shown. The output buffer 300 receives an input signal A and then transmits an output signal $V_o$, wherein the input signal A includes two logic levels, a high potential and low potential. In addition, the output signal $V_o$ varies with the input signal A.

The output buffer 300 includes driving elements 311, 312, 321 and 322 and an output element 330. After receiving the input signal A, the driving elements 311, 312, 321 and 322 produce a sufficient driving current to drive the output element 330. After that, the output element 330 provides a further great driving power to drive other outside circuits.

Each of the driving elements 311, 312, 321 and 322 has three ends, one end of which is a control end for receiving the input signal A to determine whether or not to electrically communicate between the other two ends. When the input signal A is at a low potential, the driving elements 311 and 312 are turned on to pull up the potential of a node 350 to a high potential. On the other hand, when the input signal A is at a high potential, the driving elements 321 and 322 are turned on to pull down the potential of the node 350 to the ground potential. To turn on or off the output element 330 depends on the potential of the node 350.

The driving elements 311, 312, 321 and 322 can be divided into two groups, based on the driving capability thereof. One group consists of the driving elements 311 and 321, called general driving elements. The other group consists of the driving elements 312 and 322 with more powerful driving capabilities and faster switch speeds, such that the potential of the node 350 can be swiftly changed. Moreover, the driving element 311 is turned on to pull up the potential of the node 350 to close to a positive power source Vcc while the driving element 312 is turned on to maintain the voltage drop between the node 350 and the positive power source Vcc at a constant value (for example, less than 1V). Similarly, the driving element 321 is turned on to pull down the potential of the node 350 to close to the ground potential while the driving element 322 is turned on to maintain the voltage drop between the node 350 and the ground at a constant value (for example, less than 1V).

Figure 4:
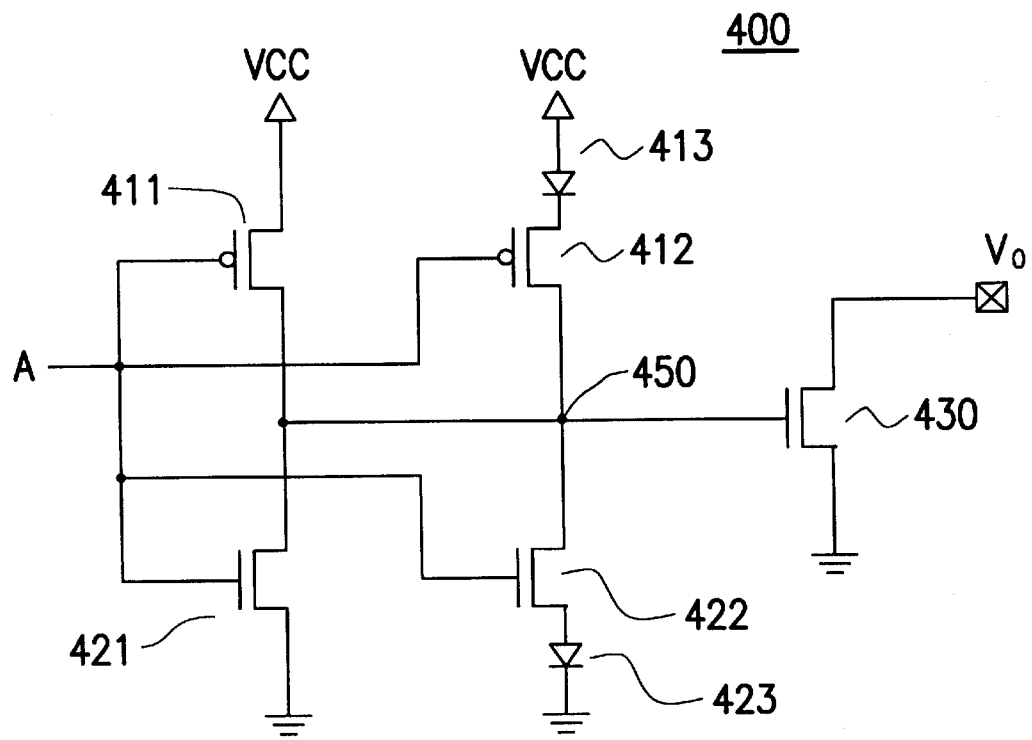
FIG. 4 is a block diagram showing an equivalent circuit of FIG. 3.

The output buffer 300 mentioned above can be further described by an equivalent circuit of FIG. 4. FET 411 functions as the driving element 311, and FET 412 and diode 413 function as the driving element 312, wherein the FETs 411 and 412 are PMOS transistors. FET 421 functions as the driving element 321, and FET 422 and diode 423 function as the driving element 322, wherein the FETs 421 and 422 are NMOS transistors. To attain the above-mentioned object, the driving capabilities of the FETs 412 and 422 are much more powerful than those of the FETs 411 and 421. Furthermore, when the diodes 413 and 423 are turned on, a voltage drop, approximately 0.7V, exits on both ends of each diode.

Figure 5:
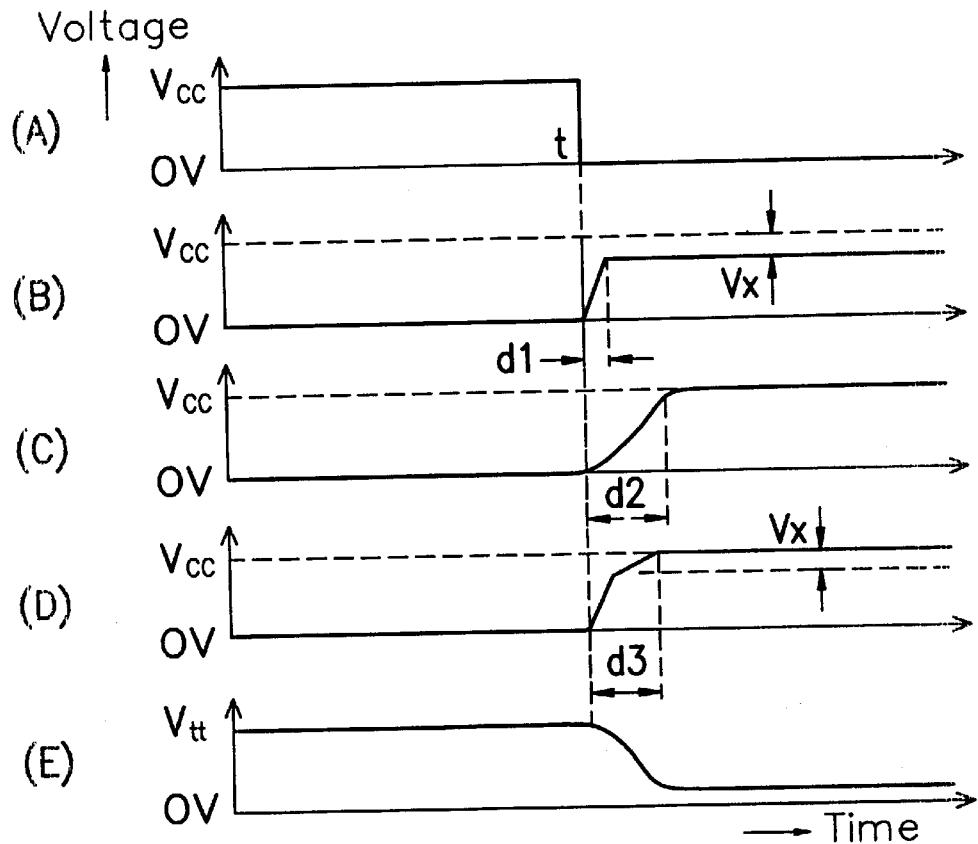
FIG. 5 shows the wave forms of the input and output signals of the equivalent circuit of FIG. 4.

The operation of the high-speed and low-noise output buffer can be described by using the wave forms of FIG. 5. As shown in FIG. 5, a wave form (A) indicates that the input signal A is changed from a high potential to a low potential at a time t. As stated above the delay time of the input signal A is omitted.

If the FET 411 is not connected and only the FET 412 and diode 413 considered are turned on, under this condition, a wave form (B) indicates the potential of the node 450. After the input signal A is changed from a high potential to a low potential, the FET 412 is completely turned on following a delay time d1. As a result, the potential of the node 450 is pull up to a voltage equal to the positive power source minus a voltage drop Vx, wherein the Vx is the foreword voltage drop 0.7V of the diode 413.

If the FET 412 is not connected and only the FET 411 considered are turned on, under this condition, a wave form (C) indicates the potential of the node 450. After the input signal A is changed from a high potential to a low potential, the FET is completely turned on following a delay time d2. As a result, the potential of the node 450 is pull up to close to the positive power source Vcc. Since the driving capability of the FET 412 is smaller than that of the FET 412, the delay time d2 is greater than the delay time d1.

If all the FETs 411 and 412 and diode 413 considered are turned on, under this condition, a wave form (D) indicates the potential of the node 450. When the input signal A is changed from a high potential, the FETs 411 and 412 are turned on simultaneously. Since the FET 412 has larger driving probability, the potential of the node 450 can be swiftly pull up to a voltage equal to the positive power source Vcc minus the voltage drop Vx. After that, the FET 411 can further pull up the potential of the node 450 to close to the positive power source Vcc. The potential of the node 450 is changed from a low potential to a high potential following a delay time d3. The result of the comparison of the magnitudes among the delay times d1, d2 and d3 is: d2>d3>d1.

Furthermore, a wave form (E) indicates the output signal Vo. When the potential of the node 450 is pull up to a high potential to turn on the FET 430, the potential of the output signal Vo is pull down to close to the ground potential. In addition, when the potential of the output signal $V_o$ starts changing, it swiftly drops due to the function of the FET 412. After the FET 412 stops functioning, the FET 411 functions alone. The variation on the potential of the output signal $V_o$ therefore becomes slowly. However, the entire dropping time is efficiently shortened. Furthermore, the ring back of the output signal Vo is alleviated. As a result, a high-speed and low-noise output buffer according to the invention can be obtained.

Figure 6:
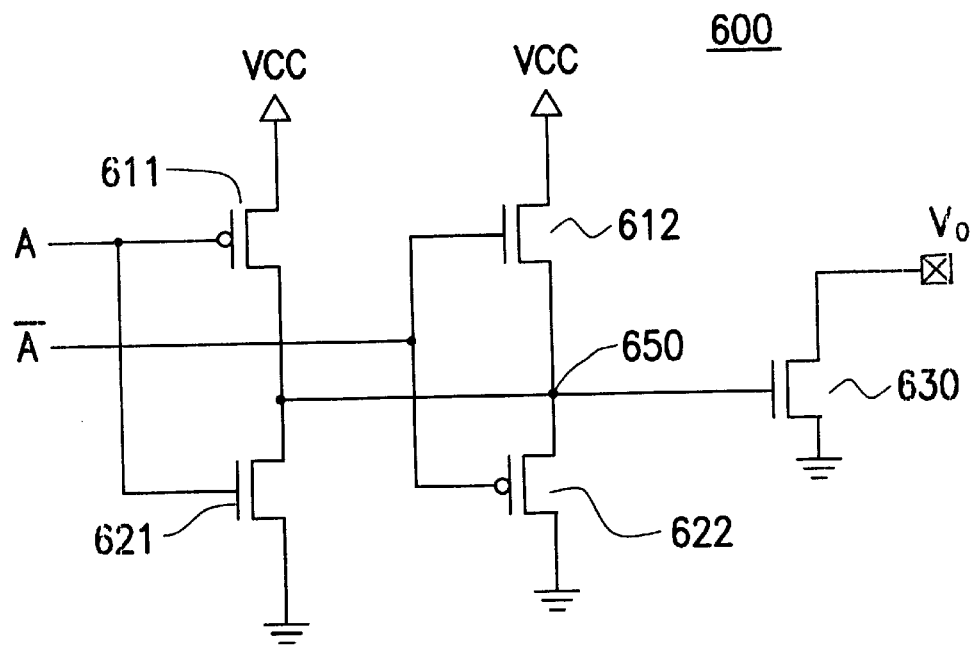
FIG. 6 shows a real circuit diagram of FIG. 3.

The driving elements in the output buffer of FIG. 4 includes the FETs and diodes. In practical manufacturing, another output buffer shown in FIG. 6 is used instead of the output buffer of FIG. 4 for better efficiency. Simultaneously referring to FIGS. 3 and 6, and FET 611 functions as the driving elements 311 while and FET 612 functions as the driving element 312, wherein the FET 611 is a PMOS transistor and the FET 612 is an NMOS transistor. Moreover, and FET 621 functions as the driving element 321 while an FET 622 functions as the driving elements 322, wherein the FET 621 is an NMOS transistor while the FET 622 is a PMOS transistor. In order to attain the same object, it is necessary that the driving capabilities of the FETs 612 and 622 are much more powerful than those of the FETs 611 and 621.

There is a different control method for the NMOS and PMOS transistors. That is, the FETs 611 and 621 receive a first input signal A while the FETs 612 and 622 receive a second input signal $\overline{A}$ which is complementary to the first input signal. Simultaneously referring to FIGS. 5 and 6, when the first input signal A is changed from a high potential to a low potential, the second input signal $\overline{A}$ (not shown) is changed from a low potential to a high potential.

First, only taking the FET 612 into consideration, after the second signal $\overline{A}$ is changed into a high potential, the FET 612 starts electrically conducting. As we know, the FET 612 has a threshold voltage. Therefore, when the FET 612 is completely turned on, the potential of the node 650 cannot be pull up to close to the a positive power source. That is, there is a constant voltage drop equal to a threshold voltage, between the positive power source Vcc and the node 650. Due to the body effect, the threshold voltage is greater than that at a normal condition. Thus, the potential variation of the node 650 is represented by the wave form (B) as shown in FIG. 5. Although the FET 612 has much more powerful driving capability, the potential of the node 650 can only be pull up to a potential equal to the positive power source Vcc minus a voltage Vx, wherein the voltage Vx is the threshold voltage of the FET 612.

Next, only the FET 611 is taken into consideration. After the first input signal A is changed into a low potential, the FET 611 starts electrically conducting. As can be seen from the wave form (C) of FIG. 5, although the switch speed of the FET 611 is slower, the potential of the node 650 can be pull up to close to the positive power source Vcc. It is obvious that when the FETs 611 and 612 simultaneously operates, the potential variation of the node 650 is represented by the wave form (D) as shown in FIG. 5. After the FETs 611 and 612 are turned on, the potential of the node 650 is swiftly pull up to a voltage equal to the positive power source Vcc minus the voltage drop Vx duo to the conducted FET 612. After the FET 612 stops functioning, the FET 611 still continues to function. As a result, the potential of the node 650 can be further pull up to close to the positive power source Vcc.

In the operation of the FETs 621 and 622 similar to that described above, the potential of the node 650 is swiftly pull down to a potential equal to a voltage drop Vx relative to the ground potential, wherein the voltage drop Vx is the threshold voltage of the FET 622. After the FET 622 stops functioning, the FET 621 still continues to operate, thereby further pull down the potential of the node 650 to close to the ground potential.

As discussed above, the function of the output buffer shown in FIG. 6 is similar to that of FIG. 4. The output buffer has less delay time and lower noise.

In the practical manufacturing of semiconductor circuits, the switch speed of each NMOS FET is directly proportion to the driving current thereof. That is, the more powerful the driving capability is, the faster the switch speed will be. In addition, the driving capability is directly proportion to the width of the gate of each FET while is inversely proportion to the length of the gate of each FET. Therefore, the driving capability of each FET can be efficiently controlled by adjusting the ration of width to length of the gate thereof. For example, the ration of width to length of each FET is set as follows: 1:7 for the FET 611 and FET 612, 1.25 for the FET 621 and FET 622. Since the mobility of PMOS FET is more poor than that of NMOS FET, the ration of width to length of the PMOS FET is twice that of the NMOS FET for a general transmission gate, so that the PMOS FET can have the same driving capability as the NMOS FET. Therefore, it can be generalized that the driving capability of the FET 612 is larger than that of the FET 611, and the driving capability of the FET 622 is larger than that of the FET 621. Moreover, the driving capabilities of the FETs 612 and 622 are much more powerful than those of the FETs 611 and 621.

Therefore, the basic concept of the invention is different to the general transmission gate. Furthermore, since the FET 630 is the one to really provide an output current to outside, it has the most powerful driving capability.

According to the invention, a high-speed and low-noise output buffer with a slew control function in coordination with the GTL+ signal specification is provided. In the output buffer, general and speed driving elements concurrently drives a last output element. As an input signal is changed from a first logic level to a second logic level, the general and speed driving elements simultaneously start functioning. First, the speed driving element pull s down the control voltage of the output element to a potential having a potential difference from an expected final potential. Then, the general driving element further pulls down the control voltage to close to the expected final potential. Therefore, the output potential of the output element changes more quickly at the beginning. When close to the expected final potential, the variation of the output potential slows down. Since, the delay time of the output buffer is reduced without causing an over large ring back on the output signal, the output buffer with high-speed and low-noise can be obtained.

As compared to the prior art, a high-speed and low noise output buffer according to the invention has the following advantages.

(1) When the general and speed driving elements simultaneously function to turn on or off the output transistor, the control voltage of the output element is originally swiftly changed and then is slowly changed into the expected final potential, so that the switch speed of the output buffer is greatly increased and the delay time is efficiently reduced to raise the operating frequency thereof.

(2) Since the output signal is originally swiftly changed and then is slowly changed into the expected final potential, such that an over large ring back is prevented, resulting in the reduction of noises.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangement.

What is claimed is:

1. A high-speed and low-noise output buffer, which receives a first input signal comprising a first logic level and a second logic level and a second input signal complementary to the first input signal and transmits an output signal, the output buffer comprising:

a first general transistor, the gate of which receives the first input signal and the source of which is coupled to a positive power source, wherein the first general transistor is electrically conducted between the drain and the source thereof when the input signal is at the first logic level;

a first speed transistor, the driving capability of which is much more powerful than that of the first general transistor, the gate of which receives the second input signal and the source of which is coupled to the positive power source, wherein the first speed transistor is electrically conducted between the drain and the source thereof when the first input signal is at the first logic level, and a first potential difference exits between the drain and the source thereof after the first speed transistor is electrically conducted;

a second general transistor, the gate of which receives the first input signal and the source of which is coupled to ground, wherein the second general transistor is electrically conducted between the drain and the source thereof when the first input signal is at the second logic level;

a second speed transistor, the driving capability of which is much more powerful than that of the second general transistor, the gate of which receives the second input signal and the source of which is coupled to the ground, wherein the second speed transistor is electrically conducted between the drain and the source thereof when the first input signal is at the second logic level, and a second potential difference exits between the drain and the source thereof after the second speed transistor is electrically conducted; and an output transistor, the gate of which is coupled to the drain of the first general transistor, the drain of the first speed transistor, the drain of the second general transistor and the drain of the second speed transistor, the source of which is coupled to the ground and the drain of which transmits the output signal, wherein the output transistor is electrically conducted between the drain and the source thereof when the first general transistor and the first speed transistor are electrically conducted, and the output transistor is not electrically conducted between the drain the source thereof when the second general transistor and the second speed transistor are electrically conducted, wherein, the first speed transistor pulls down a control voltage of the output transistor to a potential having a potential difference from an expected final potential and, the first general transistor pulls down the control voltage to close to the expected final potential.

2. The output buffer of claim 1, wherein the first logic level has a potential close to the ground.

3. The output buffer of claim 1, wherein the second logic level has a potential close to the positive power source.

4. The output buffer of claim 1, wherein the first general transistor is a PMOS FET.

5. The output buffer of claim 1, wherein the first speed transistor is an NMOS FET.

6. The output buffer of claim 5, wherein the first potential difference is about the threshold voltage of the NMOS FET.

7. The output buffer of claim 1, wherein the second general transistor is an NMOS FET.

8. The output buffer of claim 1, wherein the second speed transistor is a PMOS FET.

9. The output buffer of claim 8, wherein the second potential difference is about the threshold voltage of the PMOS FET.

10. The output buffer of claim 1, wherein the output transistor is an NMOS transistor.

11. A high-speed and low-noise output buffer, which receives an input signal comprising a first logic level and a second logic level, and transmits an output signal, the output buffer comprising:

a first general driving element which has a first end, a second end and a third end, wherein the first end receives the input signal, the second end is coupled to a positive power source, and the first general driving element is electrically conducted between the second end and the third end thereof when the input signal is at the first logic level;

a first speed driving element, the driving capability of which is much more powerful than that of the first general driving element and which has a first end, a second end and a third end, wherein the first end receives the input signal; the second end is coupled to the positive power source, wherein the first speed driving element is electrically conducted between the second end and the third end thereof when the input signal is at the first logic level, and a first potential difference exits between the second end and the third end after the first speed driving element is electrically conducted;

a second general driving element which has a first end, a second end and a third end, wherein the first end receives the input signal, the third end is coupled to ground, and the general driving element is electrically conducted between the second end and the third end thereof when the input signal is at the second logic level;

a second speed driving element, the driving capability of which is much more powerful than that of the second general driving element and which has a first end, a second end and a third end, wherein the first end receives the input signal, the third end is coupled to the ground, the second speed driving element is electrically conducted between the second end and the third end thereof when the input signal is at the second logic level, and a second potential difference exits between the second end and the third end after the first speed driving element is electrically conducted; and an output element which has a first end, a second end and a third end, wherein the first end of the output element is coupled to the third end of the first general driving element, the third end of the first speed driving element, the second end of the second general driving element and the second end of the second speed driving element, the third end of the output element is coupled to the ground, the second end of the output element transmits the output signal, the output element is electrically conducted between the second end and the third end thereof when the first general driving element and the first speed driving element are electrically conducted, and the output element is not electrically conducted between the second end and the third end thereof when the second general driving element and the second speed driving element are electrically conducted, wherein, the first speed driving element pulls down a control voltage of the output element to a potential having a potential difference from an expected final potential and, the first general driving element pulls down the control voltage to close to the expected final potential.

12. The output buffer of claim 11, wherein the first potential difference is in the range of 0V to 1V.

13. The output buffer of claim 11, wherein the second potential difference is in the range of 0V to 1V.

* * * * *